(12) United States Patent
Jang et al.

(10) Patent No.: US 10,217,882 B2
(45) Date of Patent: Feb. 26, 2019

(54) QUANTUM ROD, SYNTHESIS METHOD OF THE SAME AND QUANTUM ROD DISPLAY DEVICE

(71) Applicant: LG DISPLAY CO., LTD., Seoul (KR)

(72) Inventors: Kyung-Kook Jang, Paju-si (KR); Byung-Geol Kim, Paju-si (KR); Wy-Yong Kim, Seoul (KR); Kyu-Nam Kim, Paju-si (KR); Sung-Il Woo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/702,187

(22) Filed: Sep. 12, 2017

(65) Prior Publication Data
US 2018/0074254 A1   Mar. 15, 2018

(30) Foreign Application Priority Data

Sep. 13, 2016   (KR) .................. 10-2016-0118108

(51) Int. Cl.
*H01L 31/0352*  (2006.01)
*F21V 8/00*  (2006.01)
(Continued)

(52) U.S. Cl.
CPC ........ *H01L 31/035209* (2013.01); *C08K 3/28* (2013.01); *C09K 11/00* (2013.01); *C09K 11/0811* (2013.01); *G02B 5/3025* (2013.01); *G02B 6/0056* (2013.01); *G02F 1/1335* (2013.01); *G09F 9/30* (2013.01); *H01L 21/0256* (2013.01); *H01L 21/02474* (2013.01);
(Continued)

(58) Field of Classification Search
None
See application file for complete search history.

(56) References Cited

U.S. PATENT DOCUMENTS 6,225,198 B1 * 5/2001 Alivisatos .............. B82Y 30/00
257/64
9,758,808 B1 * 9/2017 Maye ....................... C12Q 1/66
(Continued)

FOREIGN PATENT DOCUMENTS

CN   103154183 A   6/2013
CN   103543553 A   1/2014
(Continued)

OTHER PUBLICATIONS

Talapin, Dmitri V., et al. "CdSe/CdS/ZnS and CdSe/ZnSe/ZnS Core-Shell-Shell Nanocrystals." The Journal of Physical Chemistry B, vol. 108, No. 49, 2004, pp. 18826-18831, doi:10.1021/jp046481g.*
(Continued)

*Primary Examiner* — Joseph Schoenholtz
(74) *Attorney, Agent, or Firm* — Birch, Stewart, Kolasch & Birch, LLP

(57) ABSTRACT

A quantum rod, a synthesis method of the quantum rod and a quantum rod display device are discussed. The quantum rod according to an embodiment includes a core, a first shell covering the core, and a second shell covering a side of the first shell. In the quantum rod, a first thickness of the first shell is greater than a second thickness of the second shell, and a first length of the first shell is smaller than a second length of the second shell.

13 Claims, 10 Drawing Sheets

(51) Int. Cl.

| | |
|---|---|
| *H01L 21/02* | (2006.01) |
| *C08K 3/28* | (2006.01) |
| *G02B 5/30* | (2006.01) |
| *G02F 1/1335* | (2006.01) |
| *H01L 51/52* | (2006.01) |
| *H01L 33/58* | (2010.01) |
| *H01L 51/00* | (2006.01) |
| *G09F 9/30* | (2006.01) |
| *C09K 11/00* | (2006.01) |
| *C09K 11/08* | (2006.01) |
| *H01L 33/50* | (2010.01) |

(52) U.S. Cl.
CPC .. *H01L 21/02477* (2013.01); *H01L 21/02521* (2013.01); *H01L 21/02557* (2013.01); *H01L 21/02603* (2013.01); *H01L 21/02628* (2013.01); *H01L 33/50* (2013.01); *H01L 51/0094* (2013.01); *H01L 51/5203* (2013.01)

(56) References Cited

U.S. PATENT DOCUMENTS

| | | | | |
|---|---|---|---|---|
| 9,868,901 | B2* | 1/2018 | Arbell | C09K 11/883 |
| 2007/0059527 | A1* | 3/2007 | Jun | B82Y 30/00 |
| | | | | 428/402.2 |
| 2014/0326949 | A1* | 11/2014 | Xu | C09K 11/02 |
| | | | | 257/13 |
| 2015/0009440 | A1* | 1/2015 | Lee | G02F 2/02 |
| | | | | 349/42 |
| 2016/0075943 | A1 | 3/2016 | Kim et al. | |
| 2016/0096992 | A1* | 4/2016 | Guo | H01L 33/0083 |
| | | | | 252/301.33 |
| 2017/0110633 | A1* | 4/2017 | Xu | H01L 33/504 |
| 2017/0349824 | A1* | 12/2017 | Kan | C09K 11/883 |
| 2018/0040783 | A1* | 2/2018 | Shimizu | H01L 33/502 |
| 2018/0046080 | A1* | 2/2018 | Suzuki | G03F 7/0757 |

FOREIGN PATENT DOCUMENTS

| | | |
|---|---|---|
| CN | 104302729 A | 1/2015 |
| CN | 105511150 A | 4/2016 |
| CN | 105602227 A | 5/2016 |
| KR | 10-2015-0138467 A | 12/2015 |

OTHER PUBLICATIONS

Deka, Sasanka, et al. "CdSe/CdS/ZnS Double Shell Nanorods with High Photoluminescence Efficiency and Their Exploitation As Biolabeling Probes." Journal of the American Chemical Society, vol. 131, No. 8, 2009, pp. 2948-2958., doi:10.1021/ja808369e.*

Wu, Kaifeng, et al. "Universal Length Dependence of Rod-to-Seed Exciton Localization Efficiency in Type I and Quasi-Type II CdSe@CdS Nanorods." ACS Nano, vol. 9, No. 4, 2015, pp. 4591-4599., doi:10.1021/acsnano.5b01245.*

She, Chunxing, et al. "Using Shape to Control Photoluminescence from CdSe/CdS Core/Shell Nanorods." The Journal of Physical Chemistry Letters, vol. 2, No. 12, 2011, pp. 1469-1475., doi:10.1021/jz200510f.*

She et al., "Using Shape to Control Photoluminescence from CdSe—CdS Core-Shell Nanorods," The Journal of Physical Chemistry Letters, 2011, 2, pp. 1469-1475.

* cited by examiner

QUANTUM ROD, SYNTHESIS METHOD OF THE SAME AND QUANTUM ROD DISPLAY DEVICE

CROSS-REFERENCE TO RELATED APPLICATIONS

This application claims priority to and the benefit of Republic of Korea Patent Application No. 10-2016-0118108 filed in the Republic of Korea on Sep. 13, 2016, which is hereby incorporated by reference in its entirety.

BACKGROUND OF THE INVENTION

Field of the Invention

Embodiments of the invention relate to a quantum rod, and more particularly, to a quantum rod being capable of preventing damage, and a synthesis method of the quantum rod and a quantum rod display device.

Discussion of the Related Art

Recently, as society has entered in an information age, the field of display devices that represent all sorts of electrical signals as visual images has developed rapidly. For example, a flat panel display device, such as a liquid crystal display (LCD) device, a plasma display panel (PDP) device, a field emission display (FED) device, and an organic light emitting diode (OLED) device, has been introduced.

On the other hand, use of quantum rods (QR) in display devices has been researched or studied. Since the QR has a high emitting efficiency and excellent reproductivity, there are various applications for the QR. For example, the QR may be used as an emitting element for the lightening device, a display device and a light source.

Since the QR has a high extinction coefficient and excellent quantum yield, strong fluorescent light is emitted from the QR. In addition, since the wavelength of the light from the QR is controlled by the size of the QR, entire visible light can be emitted by controlling the size of the QR.

FIG. 1 is a schematic view illustrating the related art QR.

As shown in FIG. 1, the QR 10 includes a core 20 and a shell 30.

The core 20 has a nano-size and includes a semiconductor material. The shell 30 covers or surrounds the core 20 to protect the core 20. For example, the red QR 10, has been introduced in which the core 20 may be formed of CdSe and the shell 30 may be formed of CdS.

In the initial period, the emitting efficiency and the emitting wavelength of the QR 10 are maintained. However, with time, the emitting efficiency of the QR 10 is lowered, and the emitting wavelength of the QR 10 is shifted. As such, there is a problem of low reliability in the related art QR.

SUMMARY OF THE INVENTION

Accordingly, embodiments of the invention are directed to a QR, a synthesis method of the QR and a QR display device that substantially obviate one or more of the problems due to limitations and disadvantages of the related art, and have other advantages.

An objective of the invention is to provide a QR having high reliability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

Embodiments also relate to a quantum rod including a core; a first shell covering the core; and a second shell covering a side of the first shell, wherein a first thickness of the first shell is greater than a second thickness of the second shell, and a first length of the first shell is smaller than a second length of the second shell.

Embodiments also relate to a quantum rod display device including a first substrate and a second substrate facing each other; a pixel electrode and a common electrode on the first substrate and alternately arranged with each other; and a quantum rod layer between the first substrate and the second substrate and including a quantum rod, wherein the quantum rod includes a core, a first shell covering the core, and a second shell covering a side of the first shell, and wherein a first thickness of the first shell is greater than a second thickness of the second shell, and a first length of the first shell is smaller than a second length of the second shell. The quantum rod display device further includes a backlight unit under the first substrate.

Embodiments also relate to a synthesis method of a quantum rod including forming a core; forming a first shell by mixing a semiconductor material, a C4 to C8 organic acid and a C14 to C20 organic acid and reacting with the core; and forming a second shell by mixing a semiconductor material, a C1 to C3 organic acid, a C4 to C8 organic acid and a C14 to C20 organic acid and reacting with the first shell covering the core.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to embodiments of the invention, examples of which are illustrated in the accompanying drawings.

Figure 1:
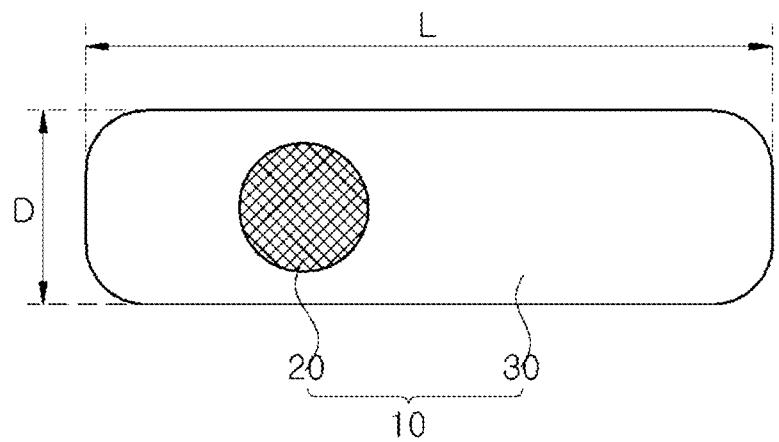
FIG. 1 is a schematic view illustrating the related art QR.

Referring to FIG. 1, in the shell 30 of the related art QR 10, a length L is greater than a thickness (or a diameter) D such that a driving property of the QR 10 is improved.

When the voltage is not applied to the QR 10, the hole and the electron are combined in the core 20 such that the QR 10 has an emitting state. On the other hand, when the voltage is applied to the QR 10, the hole and the electron are separated such that the QR 10 has a non-emitting state. To improve the off-property of the QR 10, an aspect ratio (L/D) of the QR 10 should be increased. Namely, in the QR 10, the shell 30 has the length L being greater than the thickness D.

However, when the thickness D of the shell 30 is decreased, oxygen or moisture is penetrated into the core 20 through the shell 30 such that damage occurs in the core 20. As a result, the emitting efficiency of the QR 10 is lowered, and the emitting wavelength of the QR 10 is shifted. In addition, the off-property of the QR 10 is degraded by damage on the core 20.

For example, the ligand on the shell 30 may be separated or removed from the shell 30 by the moisture and/or oxygen such that defects may be generated on the shell 30. As a result, the moisture and/or oxygen may be penetrated into the core 20.

In the synthesis of the QR 10, the growth of the thickness D is inversely proportional to the length L of the QR 10. Accordingly, there is a limitation in the QR 10 with larger length L for the driving property and larger thickness D for preventing damage on the core 20.

In the present invention, the thickness of the QR is increased without decreasing the length of the QR such that damage on the QR is prevented without decreasing the driving property of the QR.

Figure 2:
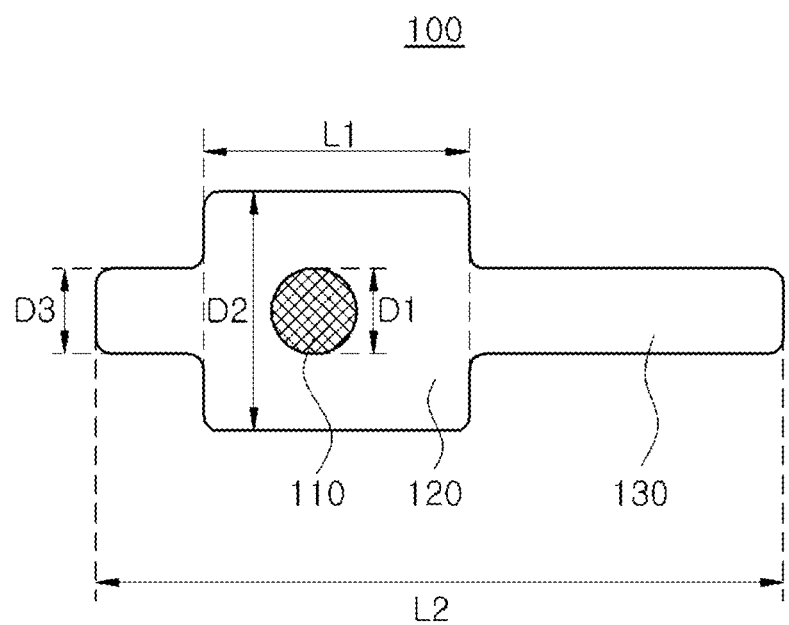
FIG. 2 is a schematic view illustrating a QR according to an embodiment of the present invention.

FIG. 2 is a schematic view illustrating a QR according to an embodiment of the present invention.

As shown in FIG. 2, a QR 100 in an embodiment of the present invention includes a core 110, a first shell 120 covering (or surrounding) the core 110 and a second shell 130 connected to a side of the first shell 120. A ligand may be connected or combined to a surface of the first shell 120 and the second shell 130.

The core 110 may have a sphere shape. The core 110 may have a first thickness (or a diameter) D1. For example, the first thickness D1 may be about 4 to 5 nm. Alternatively, the core 110 may have an oval shape or a rectangular shape. In this instance, the first thickness D1 may be a length of the core 110 along a minor axis of the QR 100.

The core 110 includes a semiconductor material. For example, the core 110 may include a II-IV group compound. The core 110 may include at least one selected from the group consisting of CdSe, CdSeS, ZnSe, ZnSeS, CdZnSe, CdZnSeS, HgSe and HgSeS.

The first shell 120 completely covers the core 110 and has a second thickness (or a diameter) D2 and a first length L1. The first length L1 of the first shell 120 is a length of the first shell 120 along a major axis of the QR 100.

To sufficiently protect the core 110, the second thickness D2 of the first shell 120 is greater than the first thickness D1 of the core 110. The second thickness D2 may be about 2.5 to 4 times the first thickness D1. For example, the second thickness D2 may be about 10 to 20 nm.

When the second thickness D2 of the first shell 120 is too small (e.g., less than 2.5 times the first thickness D1), the core 110 is insufficiently protected. On the other hand, when the second thickness D2 of the first shell 120 is too big (e.g., more than 4 times the first thickness D1), the first length L1 of the first shell 120 is decreased such that the aspect ratio of the QR 100 is reduced.

To sufficiently protect the core 110, the first length L1 of the first shell 120 is greater than the first thickness D1 (i.e., a horizontal length) of the core 110. The first length L1 may be about 3 to 6 times the first thickness D1.

In addition, the first length L1 of the first shell 120 is greater than the second thickness D2. The first length L1 may be about 1.5 to 2.5 times the second thickness D2.

When the first length L1 of the first shell 120 is too small (e.g., less than 3 times the first thickness D1 or less than 1.5 times the second thickness D2), the core 110 is insufficiently protected at a corner of the first shell 120. On the other hand, when the first length L1 of the first shell 120 is too big (e.g., more than 6 times the first thickness D1 or more than 2.5 times the second thickness D2), the second thickness D2 of the first shell 120 is decreased such that the core 110 is insufficiently protected at a thickness direction of the first shell 120.

The second shell 130 is connected to the side of the first shell 120 and extends along the major axis direction of the QR 100. The second shell 130 has a third thickness (or a diameter) D3 and a second length L2. The second length L2 of the second shell 130 is a length of the second shell 130 along a major axis of the QR 100. The second shell 130 is connected to both sides of the first shell 120 without a center portion. Accordingly, the second length L2 is defined as a length of the QR 100.

The third thickness D3 of the second shell 130 may be equal to or smaller than the first thickness D1 of the core 110.

In the related art QR 10 (FIG. 1), a thickness D of the shell 30, which covers the core 20, should be greater than a diameter (thickness) of the core 20. However, in the QR 100 in an embodiment of the present invention, the third thickness D3 of the second shell 130 may be equal to or smaller than the first thickness D1 of the core 110 since the core 110 is protected by the first shell 110.

The second length L2 of the second shell 130 may be about 2 to 3 times the first length L1 of the first shell 120. For example, the second length L2 may be about 60 to 90 nm.

The aspect ratio of the QR 100 is defined by the third thickness D3 and the second length L2 of the second shell 130. As mentioned above, since the third thickness D3 of the second shell 130 may be equal to or smaller than the first thickness D1 of the core 110, the aspect ratio of the QR 100 is increased with a constant second length L2.

Each of the first shell 120 and the second shell 130 includes a semiconductor material having an energy band gap greater than the core 110. When the energy band gap of the core 110 is smaller than that of each of the first shell 120 and the second shell 130, the exciton generated in the QR 100 emits in the core 110 such that the quantum efficiency of the QR 100 is increased. For example, each of the first shell 120 and the second shell 130 may include at least one selected from the group consisting of CdSeS, CdS, ZnSeS, ZnS, HgSeS and HgS. The first shell 120 and the second shell 130 may include the same material.

In the QR 100 in an embodiment of the present invention, the core 110 is sufficiently protected by the first shell 120 having the second thickness D2 greater than the third thickness D3 of the second shell 130. Accordingly, the problems of emitting efficiency decrease and emitting wavelength shift by damage on the core are prevented.

In addition, since the second length L2 of the second shell 130 is greater than the first length L1 of the first shell 120, the aspect ratio of the QR 110 is not decreased. Accordingly, the driving property of the QR 100 is not degraded.

Namely, there are advantages in both the emitting property and the driving property.

Synthesis of the QR

Figure 3A:
FIG. 3A, FIG. 3B and FIG. 3C are schematic views illustrating products in a synthesis process of a QR according to embodiments of the present invention.
Figure 3B:
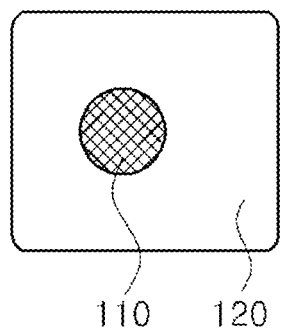
Figure 3C:
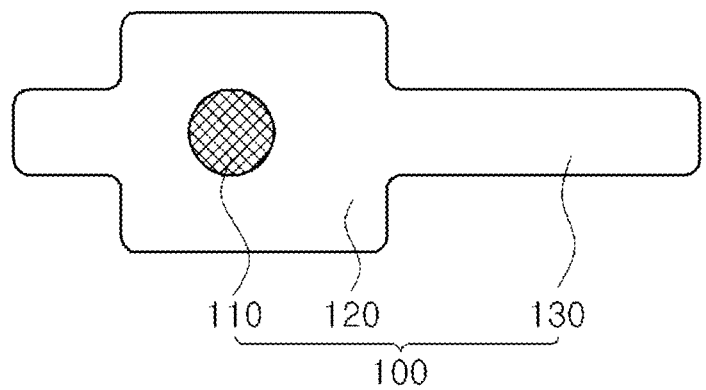

Referring to FIGS. 3A to 3C, which are schematic views illustrating products in a synthesis process of a QR according to embodiments of the present invention, the synthesis of the QR is explained.

1. CdSe Core (110 of FIG. 3A)

(1) CdO (600 mg), octadecylphosphonic acid (290 mg~360 mg) and trioctylphosphine oxide (3 g) were injected into the triangular flask (Erlenmeyer flask) and stirred under a vacuum condition (120° C., 1 hr).

(2) The triangular flask was heated to 300° C. in the stream of nitrogen, and selenium solution (1.5 mL, 1 mM trioctylphosphine) was injected.

(3) After 30 seconds reaction, the triangular flask was cooled to the room temperature to stop the growth, and the resultant was refined (or purified) using toluene and ethanol to obtain the CdSe core.

2. CdS First Shell (120 of FIG. 3B)

(1) CdO (600 mg), octadecylphosphonic acid (290 mg), hexylphosphonic acid (10~30 mg) and trioctylphosphine oxide (3 g) were injected into the triangular flask and stirred under a vacuum condition (120° C., 1 hr).

(2) The triangular flask was heated to 250° C. in the stream of nitrogen, and sulfur solution (3 mL, 1 mM octadecene) and the CdSe core (30 mg) were injected.

(3) After 10 minutes reaction under 200° C., the reactant was cooled to the room temperature. The resultant was refined (or purified) using toluene and ethanol to a first QR of CdSe/CdS.

3. QR (CdSe/CdS/CdS)

(1) CdO (120 mg), octadecylphosphonic acid (180 mg), methylphosphonic acid (10~20 mg), hexylphosphonic acid (60~90 mg) and trioctylphosphine oxide (3 g) were injected into the triangular flask and stirred under a vacuum condition (120° C., 1 hr).

(2) The triangular flask was heated to 380° C. in the stream of nitrogen, and sulfur solution (6 mL, 1 mM octadecene) and the CdSe/CdS first QR (8 mg) were injected.

(3) After 30 minutes reaction under 380° C., the reactant was cooled to the room temperature. The resultant was refined (or purified) using toluene and ethanol to the QR 100 including the core 110, the first shell 120 and the second shell 130.

The first shell 120 and the second shell 130 of the QR 100 are synthesized by separated steps. Namely, after the first shell 120 is formed on the core 110, the synthesis step of the second shell 130 is performed.

In the synthesis step of the first shell 120, a semiconductor oxide (e.g., CdO), C14 to C20 organic acid (e.g., octadecylphosphonic acid) and C4 to C8 organic acid (e.g., hexylphosphonic acid) are mixed and stirred. In this instance, a weight ratio of C4 to C8 organic acid to C14 to C20 organic acid may be about 1:10 to 1:30. With the weight ratio, the first shell 120 having desired thickness (diameter) and length is provided.

In the synthesis step of the second shell 130, a semiconductor oxide (e.g., CdO), C14 to C20 organic acid (e.g., octadecylphosphonic acid) C1 to C3 organic acid (e.g., methylphosphonic acid) and C4 to C8 organic acid (e.g., hexylphosphonic acid) are mixed and stirred. In this instance, a weight ratio of C1 to C3 organic acid to C14 to C20 organic acid may be about 1:10 to 1:20, and a weight ratio of C4 to C8 organic acid to C14 to C20 organic acid may be about 1:2 to 1:3.

With the weight ratios, the second shell 130 having a desired thickness (diameter) and length is provided. In addition, with the weight ratios, the second shell 130 grows along the horizontal direction except the vertical direction. Namely, in the synthesis step of the second shell 130, when the weight ratio between the C1 to C3 organic acid to C14 to C20 organic acid and between the C4 to C8 organic acid to C14 to C20 organic acid does not meet the above ranges the second shell 130 grows along the vertical direction as well as the horizontal direction such that the aspect ratio of the QR 100 is decreased or the QR 100 does not have the desired aspect ratio.

Figure 4A:
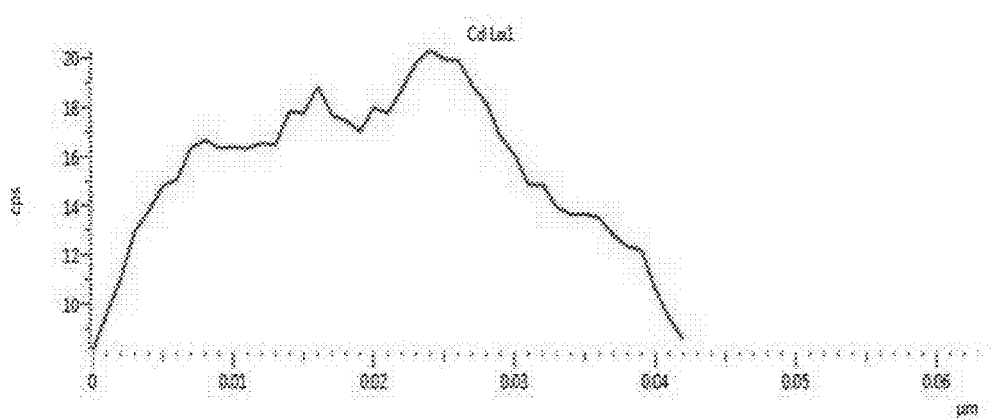
FIG. 4A and FIG. 4B are graphs showing a first shell of a QR according to embodiments of the present invention.
Figure 4B:
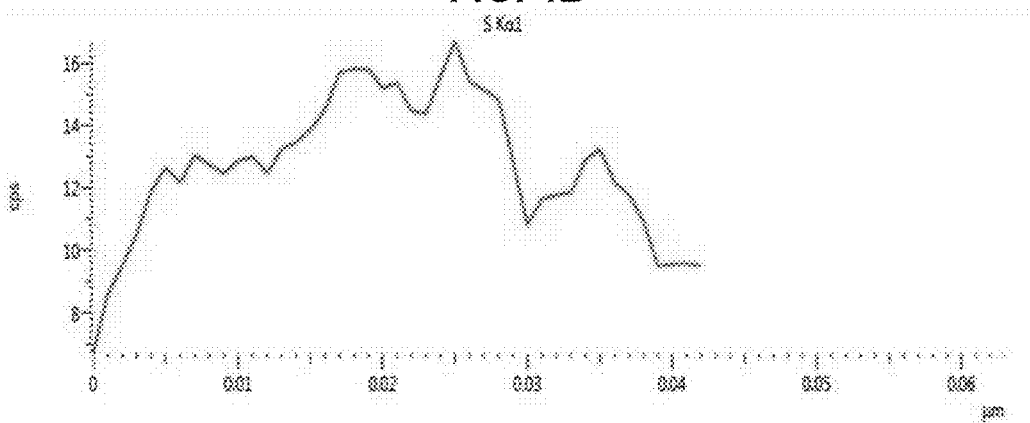

FIGS. 4A and 4B are graphs showing a first shell of a QR according to embodiments of the present invention. The graphs in FIGS. 4A and 4B are an energy dispersive spectroscopy spectrum measured along a length direction of the QR. (y axis: counts per second)

As shown in FIGS. 4A and 4B, the detection amount of the Cd atom and the S atom is increased at a center of the QR.

Namely, due the first shell 120 (FIG. 2) having a relative large thickness, the detection amount of the Cd atom and the S atom, which formed the first shell 120, is increased.

Figure 5:
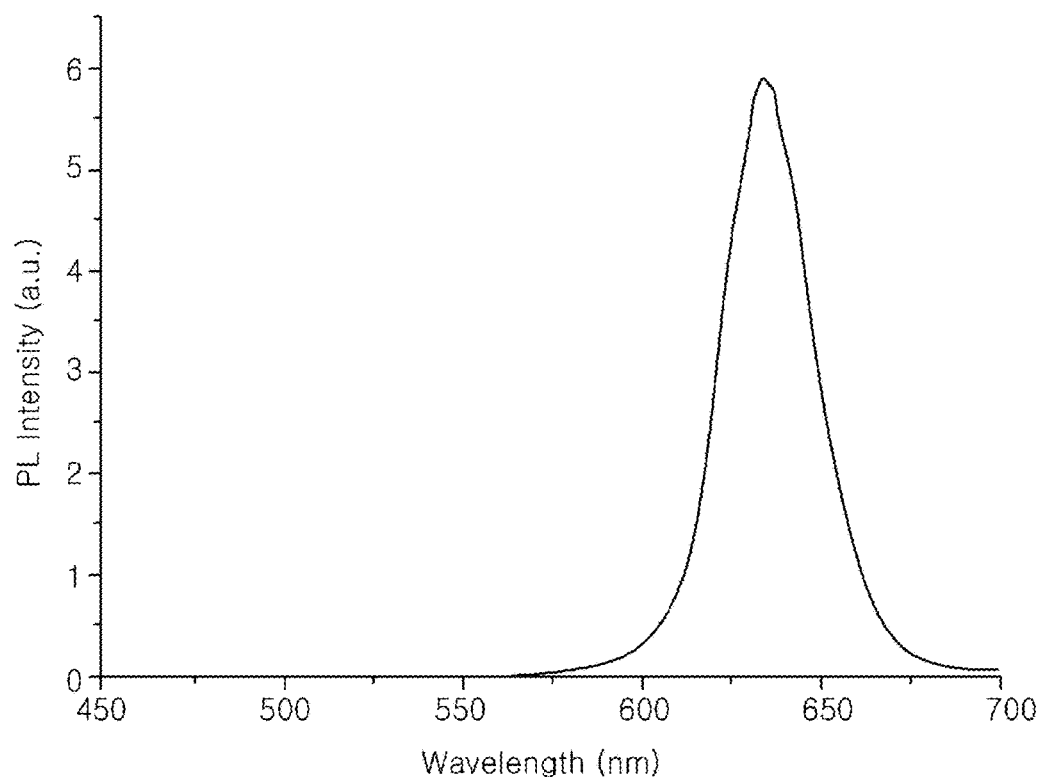
FIG. 5 is a graph showing an optical property of a QR according to an embodiment of the present invention.

FIG. 5 is a graph showing an optical property of a QR according to an embodiment of the present invention.

As shown in FIG. 5, the QR 100 (FIG. 2) has a PL intensity of about 635 nm and a full width at half maximum (FWHM) of about 29 nm. In addition, the QR 100 has a quantum efficiency of about 54%.

Figure 6:
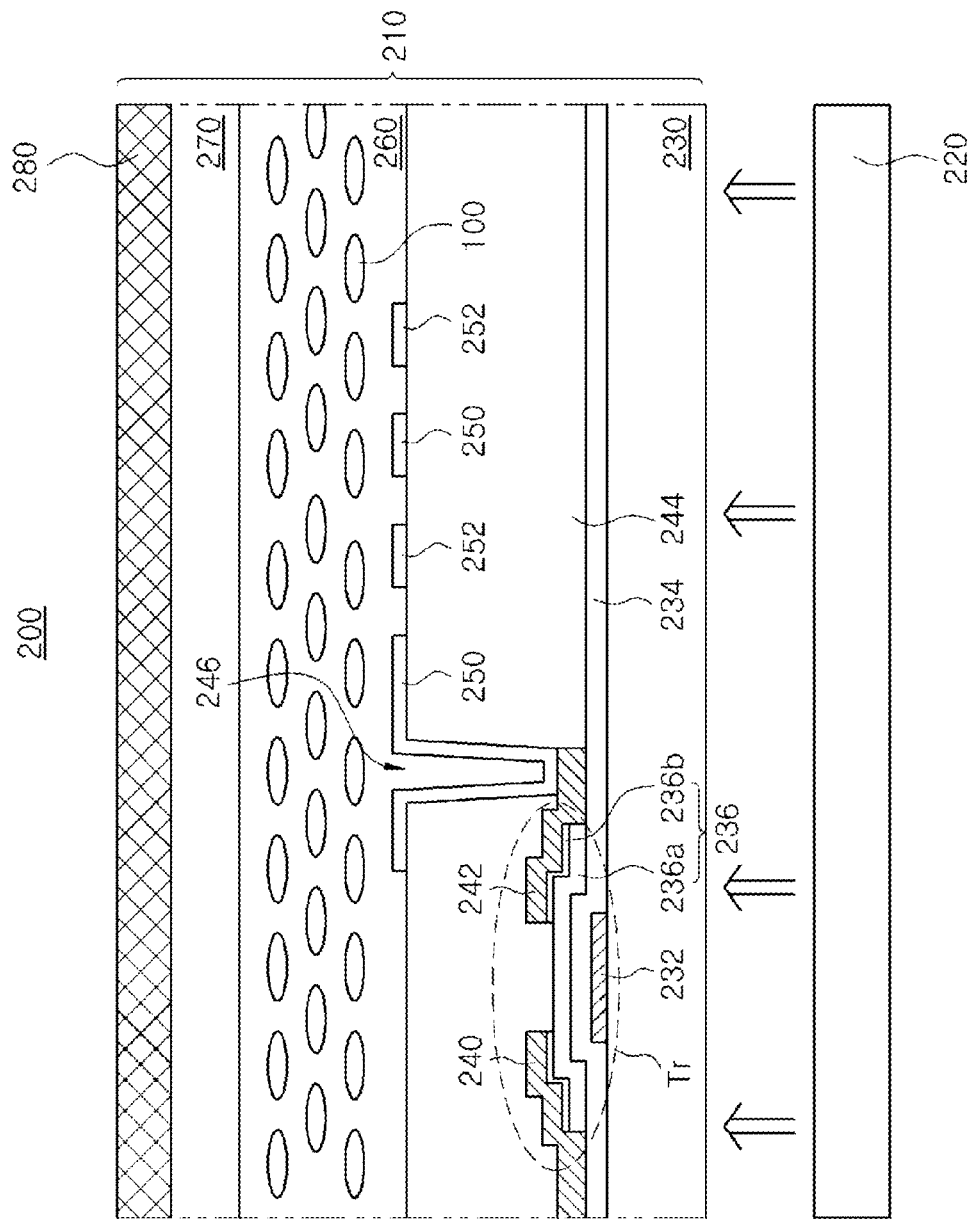
FIG. 6 is a schematic cross-sectional view of a QR display device according to an embodiment of the present invention.
Figure 7:
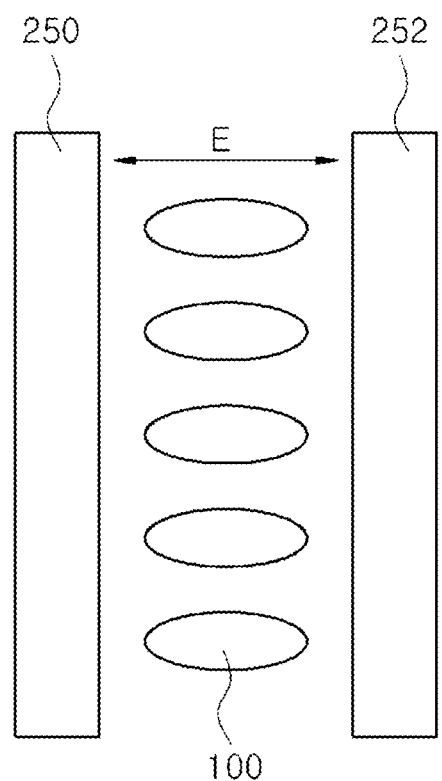
FIG. 7 is a schematic plane view illustrating the arrangement of a QR in a QR display device according to an embodiment of the present invention.

FIG. 6 is a schematic cross-sectional view of a QR display device according to an embodiment of the present invention, and FIG. 7 is a schematic plane view illustrating the arrangement of a QR in a QR display device according to an embodiment the present invention.

As shown in FIG. 6, a QR display device 200 in an embodiment of the present invention includes a QR display panel 210 and a backlight unit 220 under the QR display panel 210.

The QR display panel 210 includes a first substrate 230 and a second substrate 270 facing each other and a QR layer 260 therebetween.

On the first substrate 210, a thin film transistor (TFT) Tr, a passivation layer 244 covering the TFT Tr and a pixel electrode 250 and a common electrode 252 on the passivation layer 244 may be formed.

A gate line and a data line, which cross each other to define a pixel region, may be formed on the first substrate 230. The TFT Tr may be connected to the gate and data lines.

The TFT Tr may include a gate electrode 232, which is connected to the gate line, a gate insulating layer 234, a semiconductor layer 236, a source electrode 240, which is connected to the data line, and a drain electrode 242.

The semiconductor layer 236 may include an active layer of intrinsic amorphous silicon and an ohmic contact layer of impurity-doped amorphous silicon. Alternatively, the semiconductor layer 236 may have a single-layered structure of an oxide semiconductor material.

A drain contact hole 246, which exposes the drain electrode 242 of the TFT Tr, is formed through the passivation layer 244, and the pixel electrode 250 is connected to the drain electrode 242 through the drain contact hole 246. The common electrode 252 is spaced apart from and alternately arranged with the pixel electrode 250. When the voltage is applied, an electric field, which is substantially parallel to the substrate 230, is induced or generated between the pixel and common electrodes 250 and 252.

The QR layer 260 is positioned between the first substrate 230 and the second substrate 270 and includes a QR 100.

Referring to FIG. 3, the QR 100 includes the core 110, the first shell 120 covering (or surrounding) the core 110 and the second shell 130 connected to the side of the first shell 120. The thickness D2 of the first shell 120 is greater than the thickness D3 of the second shell 130, and the length L1 of the first shell 120 is smaller than the length L2 of the second shell 130.

In the QR 100 in an embodiment of the present invention, the core 110 is sufficiently protected by the first shell 120 such that damage on the core 110 by moisture and/or oxygen are prevented. In addition, due to the second shell 130, the QR 100 has a sufficient aspect ratio such that the driving property of the QR 100 is improved.

The QR 100 is arranged along the electric field between the pixel 250 and common electrode 252. Referring to FIG. 7, the QR 100 has a rod shape having a major axis and a minor axis, and the QR 100 is arranged such that the major axis of the QR 100 is parallel to the electric field E between the pixel 250 and common electrodes 252. In other words, the major axis of the QR 100 is arranged along a direction being substantially perpendicular to an extension direction of the pixel 250 and common electrodes 252.

For example, when the electric field E is generated between the pixel 250 and common electrodes 252 in randomly arranged QRs 100, the QRs 100 are arranged such that the major axis of the QR 100 is parallel to the electric field E. Sequentially, a curing process is performed such that the QR layer 260 including regularly arranged QRs 100 is provided. Namely, the QR display device 200 does not require an alignment layer and an aligning process for the related art LCD device.

The second substrate 270 is attached to the first substrate 230 with the QR layer 260 therebetween and does not includes a color filter. Namely, the related art LCD device requires the color filter to provide the full color image. However, in the QR display device 200 in an embodiment of the present invention, the pixel regions include the QRs 100 having a difference in a size of the core, and the QR 100 absorbs the light from the backlight unit 220 and emits the visible light having a difference in a wavelength. Accordingly, the QR display device 200 can provide the full color image without the color filer.

The backlight unit 220 include a UV light source and may be classified into a direct type and an edge type depending on a position of the UV light source. For example, the backlight unit 220 may include the UV light source, a light guide plate at a side of the UV light source and under the QR display panel 210, a reflective sheet under the light guide plate and an optical sheet between the light guide plate and the QR display panel 210.

The QR 100 absorbs the UV light from the backlight unit and emits the visible light.

A polarization plate 280 having a transmitting axis parallel to the major axis of the QR 100 is disposed on an outer side of the second substrate 270, while there is no polarization plate under the first substrate 230. Since the QR 100 emits a linearly-polarized light along the major axis of the QR 100, a lower polarization plate required in the related art LCD device can be omitted. Namely, the first substrate 230 of the QR display panel 210 may directly face the backlight unit 230 without a polarization plate.

In addition, the polarization plate 280 on the second substrate 270 may be omitted. However, since the QR 100 emits the linearly-polarized light along the minor axis as well as the major axis (the linearly-polarized light along the major axis is a major polarization component of the QR 100), it is preferred to form the polarization plate 280 for a high quality image.

As mentioned above, since the color filter and at least one polarization plate are omitted in the QR display device 200, there are advantages in the production cost and the thickness in comparison to the related art LCD device.

Figure 8A:
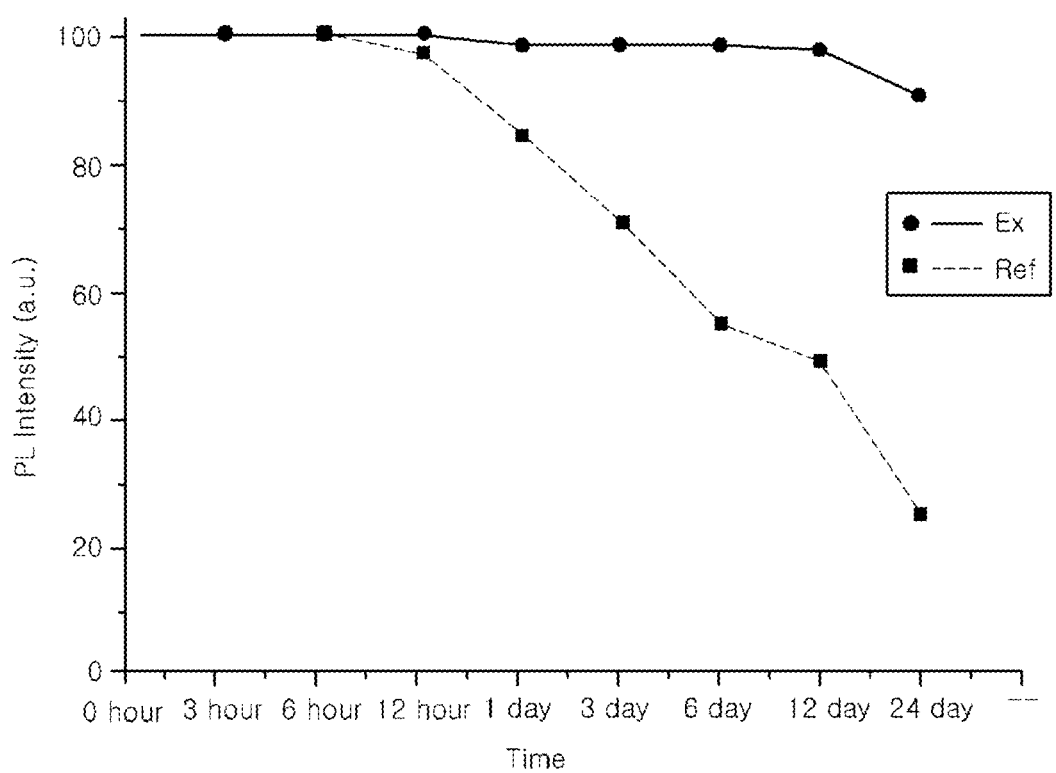
FIGS. 8A and 8B are graphs showing optical properties of the related art QR and a QR according to the present invention.
Figure 8B:
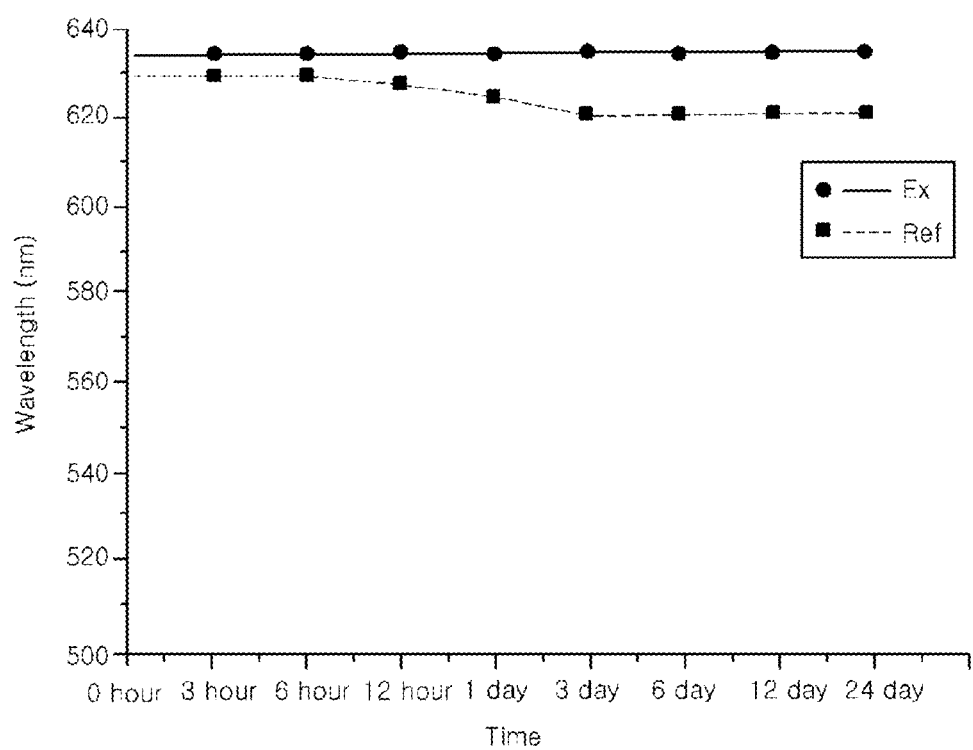

FIGS. 8A and 8B are graphs showing optical properties of the related art QR and a QR according to an embodiment of the present invention.

As shown in FIG. 8A, the emitting amount (PL intensity) of the related art QR (Ref, 10 of FIG. 1) is changed, while the QR (Ex, 100 of FIG. 2) in an embodiment of the present invention has the uniform emitting amount.

As shown in FIG. 8B, the wavelength of the related art QR (Ref, 10 of FIG. 1) is changed, while the QR (Ex, 100 of FIG. 2) in an embodiment of the present invention has the uniform wavelength.

Namely, in the QR in an embodiment of the present invention, the damage on the core is prevented such that the optical properties are improved. Accordingly, the display quality of the QR display device 200 is improved.

Figure 9A:
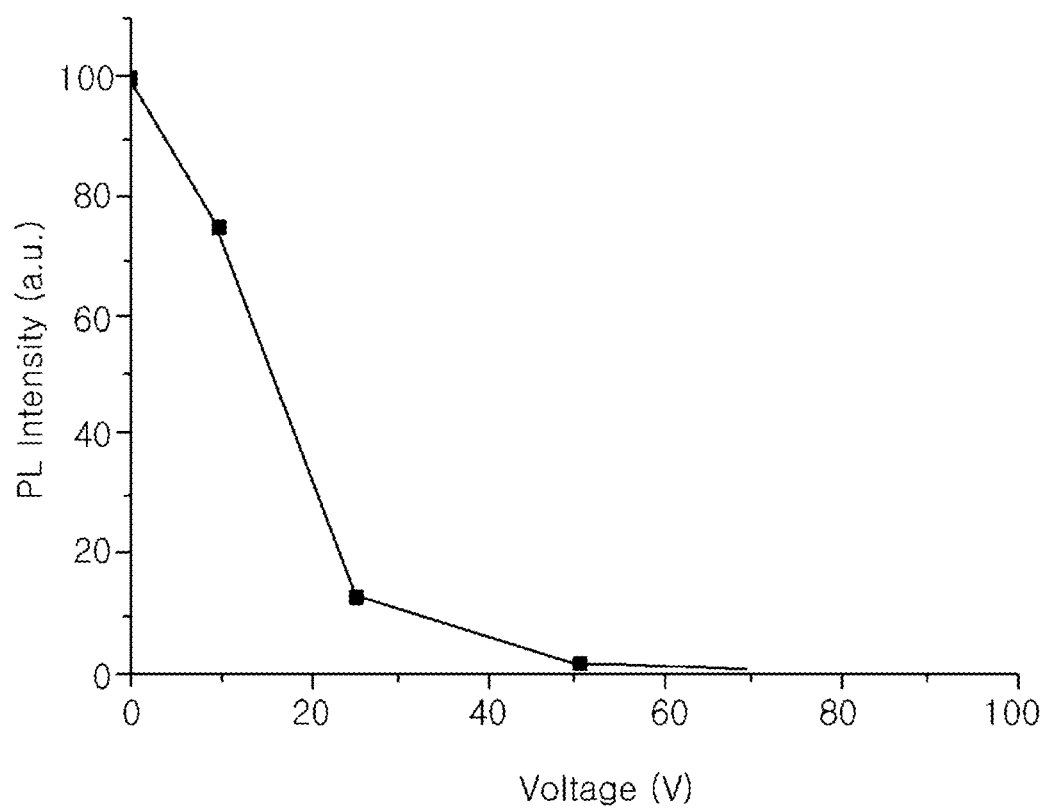
FIGS. 9A and 9B are graphs showing a driving property of the related art QR and a QR according to the present invention.
Figure 9B:
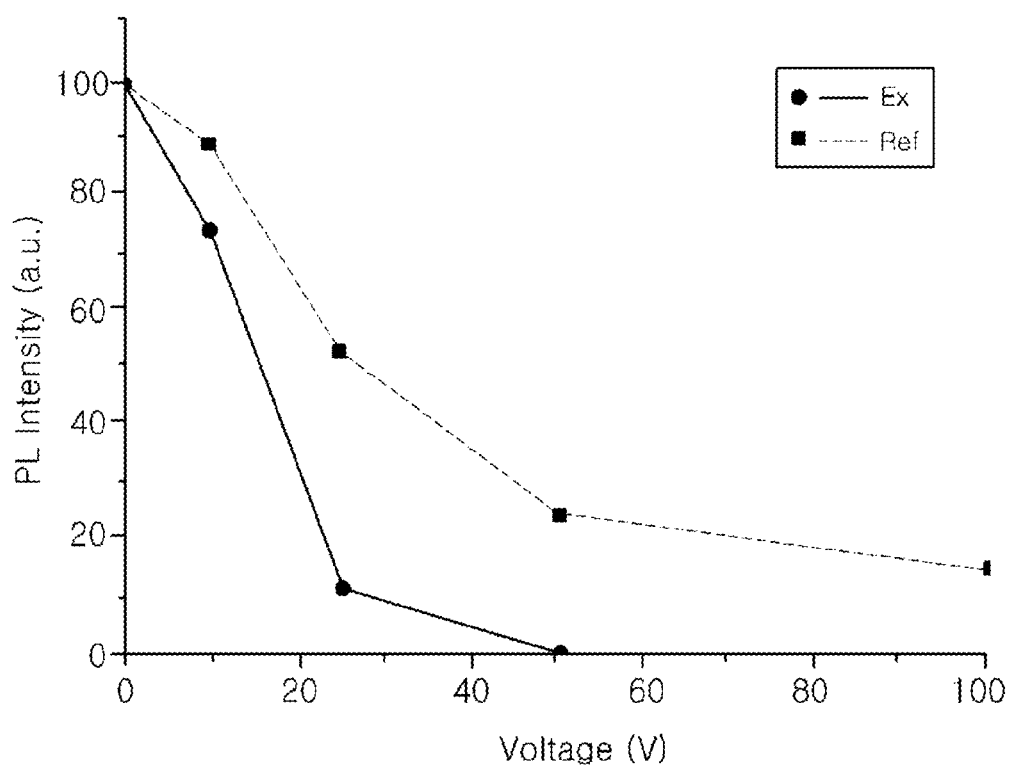

FIGS. 9A and 9B are graphs showing a driving property of the related art QR and a QR according to an embodiment the present invention. FIG. 9A shows an initial driving property of the QR, and FIG. 9B shows a driving property under the temperature of 60° C. and the humidity of 90% for 24 days.

Referring to FIG. 9A, in an initial stage, the related art QR and the QR in an embodiment of the present invention have substantially the same driving property. The Off ratio (a ratio of the PL intensities without the voltage (without the electric field) and with the voltage (with the electric field) is listed in Table 1.

TABLE 1

| | | Voltage (V) | | | | |
|---|---|---|---|---|---|---|
| | | 0 | 10 | 25 | 50 | 100 |
| Off ratio [%] | Ref | 0 | 24 | 87 | 99 | 100 |
| | Ex | 0 | 25 | 87 | 99 | 100 |

However, referring to FIG. 9B, the voltage for the off of the related art QR (Ref) is increased, while the voltage for the off of the QR in an embodiment of the present invention is maintained.

The Off ratio is listed in Table 2.

TABLE 2

| | | Voltage [V] | | | | |
|---|---|---|---|---|---|---|
| | | 0 | 10 | 25 | 50 | 100 |
| Off ratio [%] | Ref | 0 | 10 | 46 | 75 | 85 |
| | Ex | 0 | 25 | 87 | 99 | 100 |

As shown in FIGS. 9A and 9B and Table 1 and 2, the damage on the core is prevented such that the driving property is improved. Accordingly, the driving voltage of the QR display device 200 is decreased.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

What is claimed is:

1. A quantum rod, comprising:
    a core; and
    a shell having a first portion and a second portion, the first portion entirely covering the core and the second portion extending from opposite sides of the first portion along an axis of the core and the shell,
    wherein, in a direction crossing the axis, a first thickness of the first portion is greater than a second thickness of the second portion, and in a direction of the axis, a first length of the first portion is smaller than a second length of the second portion, and
    wherein the first thickness is about 2.5 to 4 times a thickness of the core, and the first length is about 3 to 6 times a length of the core.

2. The quantum rod according to claim 1, wherein the first thickness is greater than a third thickness of the core, and the second thickness is equal to or smaller than the third thickness.

3. The quantum rod according to claim 1, wherein the second length is about 2 to 3 times the first length.

4. The quantum rod according to claim 1, wherein the core includes a first semiconductor material having a first energy band gap, and the first portion and the second portion, respectively, include a second semiconductor material having a second energy band gap and a third semiconductor material having a third energy band gap, and
    wherein each of the second energy band gap and the third energy band gap is greater than the first energy band gap.

5. The quantum rod according to claim 4, wherein the first semiconductor material is at least one selected from the group consisting of CdSe, CdSeS, ZnSe, ZnSeS, CdZnSe, CdZnSeS, HgSe and HgSeS, and each of the second semiconductor material and the third semiconductor material is at least one selected from the group consisting of CdSeS, CdS, ZnSeS, ZnS, HgSeS and HgS.

6. A quantum rod display device, comprising:
    a first substrate and a second substrate facing each other;
    a pixel electrode and a common electrode on the first substrate and alternately arranged with each other;
    a quantum rod layer between the first substrate and the second substrate and including a quantum rod; and
    a backlight unit under the first substrate,
    wherein the quantum rod includes:
        a core; and
        a shell having a first portion and a second portion, the first portion entirely covering the core and the second portion extending from opposite sides of the first portion along an axis of the core and the shell,
    wherein, in a direction crossing the axis, a first thickness of the first portion is greater than a second thickness of the second portion, and in a direction of the axis, a first length of the first portion is smaller than a second length of the second portion, and
    wherein the second length is about 2 to 3 times the first length.

7. The quantum rod display device according to claim 6, wherein the first thickness is greater than a third thickness of the core, and the second thickness is equal to or smaller than the third thickness.

8. The quantum rod display device according to claim 6, wherein the first thickness is about 2.5 to 4 times a thickness of the core, and the first length is about 3 to 6 times a length of the core.

9. The quantum rod display device according to claim 6, wherein the core includes a first semiconductor material having a first energy band gap, and the first portion and the second portion, respectively, include a second semiconductor material having a second energy band gap and a third semiconductor material having a third energy band gap, and
    wherein each of the second energy band gap and the third energy band gap is greater than the first energy band gap.

10. The quantum rod display device according to claim 9, wherein the first semiconductor material is at least one selected from the group consisting of CdSe, CdSeS, ZnSe, ZnSeS, CdZnSe, CdZnSeS, HgSe and HgSeS, and each of the second semiconductor material and the third semiconductor material is at least one selected from the group consisting of CdSeS, CdS, ZnSeS, ZnS, HgSeS and HgS.

11. The quantum rod display device according to claim 6, wherein each of the pixel electrode and the common electrodes extends along a first direction, and a major axis of the quantum rod is arranged along a second direction being substantially parallel to the first direction.

12. The quantum rod display device according to claim 11, further comprising a polarization plate at an outer side of the second substrate and having a transmitting axis being parallel to the second direction.

13. A quantum rod, comprising:
    a core;
    a first shell covering the core; and
    a second shell covering a side of the first shell,
    wherein, in a direction crossing an axis of the core and the first and second shells, a first thickness of the first shell is greater than a second thickness of the second shell, and in a direction of the axis, a first length of the first shell is smaller than a second length of the second shell, and
    wherein the second length is about 2 to 3 times the first length.

* * * * *